United States Patent [19]

Shih

[11] Patent Number: 5,684,812
[45] Date of Patent: Nov. 4, 1997

[54] LASER MODE CONTROL USING EXTERNAL INVERSE CAVITY

[75] Inventor: Chun-Ching Shih, Palos Verdes Estates, Calif.

[73] Assignee: TRW Inc., Redondo Beach, Calif.

[21] Appl. No.: 527,313

[22] Filed: Sep. 12, 1995

[51] Int. Cl.⁶ .................................................. H01S 3/098
[52] U.S. Cl. .................................................. 372/19; 372/99
[58] Field of Search .............................. 372/19, 99, 703

[56] References Cited

U.S. PATENT DOCUMENTS

| | | |
|---|---|---|
| 3,758,199 | 9/1973 | Thaxter. |
| 3,777,280 | 12/1973 | Pohl. |
| 3,936,770 | 2/1976 | Reintjes, Jr. et al. |
| 4,127,320 | 11/1978 | Li. |
| 4,151,487 | 4/1979 | Chi. |
| 4,564,949 | 1/1986 | Trolinger. |
| 4,672,616 | 6/1987 | Trost et al. ........................... 372/19 |
| 4,779,278 | 10/1988 | McKinney. |
| 4,797,894 | 1/1989 | Yaeli. |
| 4,951,285 | 8/1990 | Cole et al. |
| 4,972,427 | 11/1990 | Streifer et al. |
| 5,027,359 | 6/1991 | Leger et al. |
| 5,027,459 | 7/1991 | Leger et al. |
| 5,077,746 | 12/1991 | Ewart. |
| 5,148,443 | 9/1992 | Du et al. |
| 5,151,917 | 9/1992 | Perilloux et al. |
| 5,172,383 | 12/1992 | Magill et al. |
| 5,307,367 | 4/1994 | Karube. |
| 5,321,718 | 6/1994 | Waarts et al. |
| 5,386,431 | 1/1995 | Tulip. |

OTHER PUBLICATIONS

Kato, et al., "InGaAs/GaAs Strained Quantum Well Lasers With Etched Micro–Corner Reflectors," Int'l Conf. on Solid State Devices & Materials, pp. 446–448, Aug. 21–Aug. 24, 1995, Tokyo, JP.

Paiss, et al., "Influence of External Mirror On Model Behavior Of Twin–Stripe Index–Guided Injection Lasers," IEE, 8217 Journal of Lightwave Technology, 9(1991) Apr., No. 4, New York, US.

Primary Examiner—Rodney B. Bovernick
Assistant Examiner—Robert E. Wise
Attorney, Agent, or Firm—Michael S. Yatsko

[57] ABSTRACT

A laser mode control system for suppressing anti-symmetric resonance modes of a beam of radiation in a laser resonator cavity. The system includes a main resonator cavity in which a beam of radiation having symmetric and anti-symmetric resonance modes propagates. The main resonator cavity has at least one exit plane at a first end of the cavity through which the propagating beam of radiation passes. The system further includes an external cavity located outside of the main resonator cavity and adjacent to the exit plane. The external cavity includes a mirror for reflecting the beam of radiation passing through the exit plane and for flipping a mode profile associated with the beam of radiation upon the beam of radiation being reflected from the mirror. The external cavity also includes a partially transmissive medium between the mirror and the main resonator cavity for introducing losses to the beam of radiation in the external cavity. The mirror and the partially transmissive medium of the external cavity together suppress the higher order anti-symmetric resonance modes of the beam of radiation, thereby increasing beam quality and reducing the cavity misalignment sensitivity.

15 Claims, 3 Drawing Sheets

LASER MODE CONTROL USING EXTERNAL INVERSE CAVITY

BACKGROUND OF THE INVENTION

1. Technical Field

The present invention relates generally to laser systems, and, more particularly, to a laser mode control system for suppressing anti-symmetric resonance modes of a beam of radiation in a laser resonator cavity.

2. Discussion

Many high-power lasers such as Nd:YAG, Nd:Glass, $CO_2$ and semiconductor diode lasers have an associated high spec-ratio resonator in which, for a resonator of a particular length, the height of the resonator cavity is much greater than the cavity width, or vice versa. Such resonators may include single, multiple channel or slab type resonator cavities. In all of the above types of cavities, control of radiation resonance modes in the larger dimension of the cavity is crucial to achieving high laser beam quality. In particular, it is desirable to suppress anti-symmetric cavity modes, as these higher order modes tend to lessen beam quality and reduce the cavity alignment tolerance.

One system for cavity mode control is described in U.S. Pat. No. 5,027,359 to Leger et al., entitled "Miniature Talbot Cavity For Lateral Mode Control Of Laser Array". Such a system utilizes an external miniature Talbot cavity with a mirror to achieve mode control particularly for multi-channel type laser resonators. Talbot distance is selected for its external cavity for two purposes: to re-image the radiation back at the entrance of individual channels to minimize the coupling loss and to enhance the coherence of radiation between channels based on the diffraction effect. By selecting a proper reflecting pattern at the Talbot distance, it is possible to have a higher return for the fundamental mode (in-phase or symmetric mode, for example, having the phases ++++++++ in an 8-channel array) and block the anti-symmetric or out-of-phase modes (+−+−+−+− in the 8-channel array) from re-entering the channels. However, these anti-symmetric modes are only a small set of the undesirable high-order modes. In particular, the Talbot cavity technique cannot discriminate against other types of anti-symmetric modes (e.g. ++−−++−− or +++−−−−) which are more sensitive to the imperfect optics and cavity misalignment. Furthermore, the Talbot cavity technique will not perform mode discrimination for the resonators with a single continuous region, as it works only for resonators with multiple channels.

What is needed then is a laser mode suppression system capable of use in a variety of laser resonator cavity types that enables higher order anti-symmetric modes associated with a laser resonator cavity to be suppressed.

SUMMARY OF THE INVENTION

In accordance with the teachings of the present invention, a laser mode control system is provided for use in suppressing substantially all anti-symmetric cavity modes of a laser resonator cavity. The laser mode control system finds particular utility in high power lasers having stable single, multiple channel or slab resonator cavities. The laser mode control system of the present invention is able to discriminate against most high-order modes and thereby enhance output beam quality.

According to the teachings of the present invention, a laser mode suppression system having means for generating a beam of radiation having symmetric and anti-symmetric resonance modes is provided. A resonator means includes a resonant cavity in which the beam of radiation propagates back and forth. The resonator means includes a partially transmissive plane through which part of the propagating beam of radiation travels into an external cavity. Means for defining an external inverse cavity is also provided. The means for defining an external inverse cavity includes a mirror for flipping the mode profile of radiation passing through the transmissive plane in the resonator means. The means for defining the external inverse cavity also includes a partially transmissive medium between the transmissive plane of the resonator means and the flipping mirror for introducing losses to the beam of radiation as it travels to and is reflected from the mirror. The means for defining the external inverse cavity effectively suppresses anti-symmetric resonance modes of the beam of radiation.

Also in accordance with the teachings of the present invention, a method is provided for controlling resonance modes of a laser system, comprising the steps of propagating a beam of radiation through a main resonator cavity, causing the beam of radiation to be emitted through a first aperture in the resonator cavity, and controlling resonance modes of a laser system by propagating the beam of radiation having symmetric and anti-symmetric resonance modes through a main resonator cavity. The method further includes the steps of emitting the beam of radiation through a first aperture in the resonator cavity, reflecting the beam of radiation with a mirror external to the main resonator cavity such that the mode profile associated the beam of radiation is flipped, and introducing losses to the beam of radiation by causing the radiation to propagate through a partially transmissive medium between the aperture and the mirror. The steps of reflecting the radiation and introducing losses to the beam of radiation cause the anti-symmetric resonance modes of the beam of radiation to be suppressed.

BRIEF DESCRIPTION OF THE DRAWINGS

Other objects and advantages of the invention will become apparent upon reading the following detailed description and upon reference to the drawings, in which.

DETAILED DESCRIPTION OF THE PREFERRED EMBODIMENT

Figure 1:
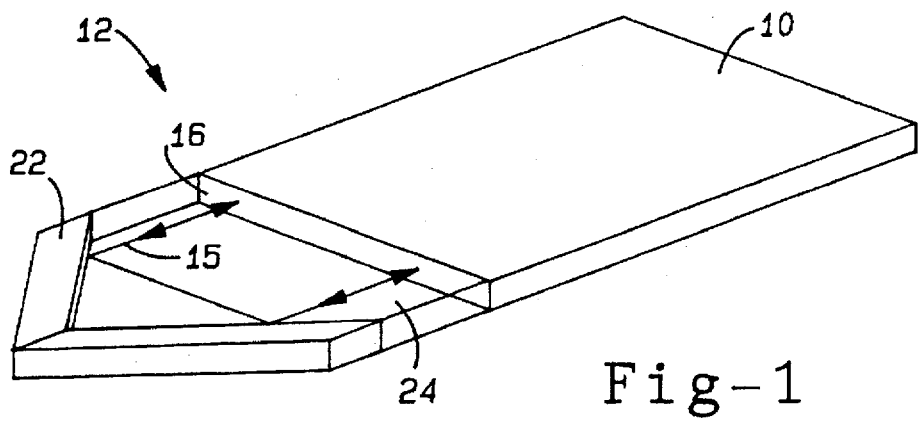
FIG. 1 is a perspective view of one embodiment of the system of the present invention.

Referring to FIG. 1, a laser resonator defining a laser resonator cavity, shown generally at 10, is in operative communication with a laser mode control system defining an external inverse cavity, shown generally at 12, in accordance with a preferred embodiment of the present invention. The external inverse cavity 12 is effective in suppressing anti-symmetric resonance modes of radiation 15 propagating within the laser resonator cavity 10 in a manner set forth in detail below. The laser resonator cavity shown in FIG. 1 is a slab-type resonator cavity of the type found in semiconductor diode lasers and to Nd:YAG, Nd:Glass, or $CO_2$ lasers. However, it should be understood that the resonator cavity 10 may be any resonator cavity of the type well known to those skilled in the art used in high power lasers. The laser resonator cavity also includes a partially transmissive plane 16 through which part of radiation propagating throughout the resonator cavity exits and reenters the resonator cavity after being conditioned by the external inverse cavity 12 of the present invention.

The external inverse cavity 12 includes both a mirror 22 and a partially transmissive medium 24, which may also be more particularly referred to as a lossy medium. The mirror 22 is preferably a roof-top mirror of the type well known to those skilled in the art. The mirror 22 is positioned as close to the plane 16 as possible to minimize the distance of propagation of the radiation 15 in the external cavity. The minimal external cavity length minimizes divergence of the radiation, allowing the radiation to retain its plane wave characteristics rather than causing the radiation to diverge and degrade the mode control effect.

The roof-top mirror 22 double-reflects the radiation that is emitted through the partially transmissive plane 16 back to the plane 16. Part of the reflected radiation is transmitted into the laser resonator cavity 10 through the plane 16. Thus, radiation travelling through the external inverse cavity 12 is subject to multiple reflections between the laser resonator 10 and the roof-top mirror 22. These multiple reflections effectively flip a mode profile associated with the beam of radiation in each pass.

Part of the flipped radiation is reflected back into the external cavity. The overall radiation in the external cavity is thus the sum of all radiations in these multiple reflections. For a symmetric mode, the flipped mode has an identical profile. For an anti-symmetric mode, the flipped mode changes sign. The characteristics of symmetric and anti-symmetric modes in the external cavity are therefore quite different. It is possible to adjust the external cavity length such that the symmetric mode has a very low intra-cavity power while the anti-symmetric mode has a high intra-cavity power. Without introducing any loss mechanism in the external cavity, both symmetric and anti-symmetric modes have the same reflectivity back into the main cavity because of energy conservation. However, if losses are introduced to the radiation in the external cavity (through the partially transmissive medium or the mirror), the anti-symmetric mode will lose more power than the symmetric mode because it has higher intra-cavity power. In this way, mode discrimination against anti-symmetric modes can be achieved.

The partially transmissive medium 24 is positioned between the laser resonator 10 and the roof-top mirror 22. Radiation exiting the plane 16 must travel through the partially transmissive medium 24 both before and after being subjected to the multiple reflections at the roof-top mirror 22. The partially transmissive medium 24 is composed of a material that introduces losses to the propagating modes of the radiation as the radiation travels in the external inverse cavity. Typically, this partially transmissive medium is the material composing a semiconductor in a diode laser array. However, in solid state and gas lasers, the medium may also be composed of a semi-transparent material.

It should be appreciated that the symmetric and anti-symmetric modes of the radiation have different intensities in the partially transmissive medium. The anti-symmetric modes have a higher associated energy and thus exhibit greater losses in the partially transmissive medium 24. Thus, the anti-symmetric modes of the radiation may be suppressed, while the symmetric modes of the radiation are allowed to survive, when correct parameters are chosen for the external roof-top mirror 22 and the partially transmissive medium 24 as will be described in more detail below.

Figure 2:
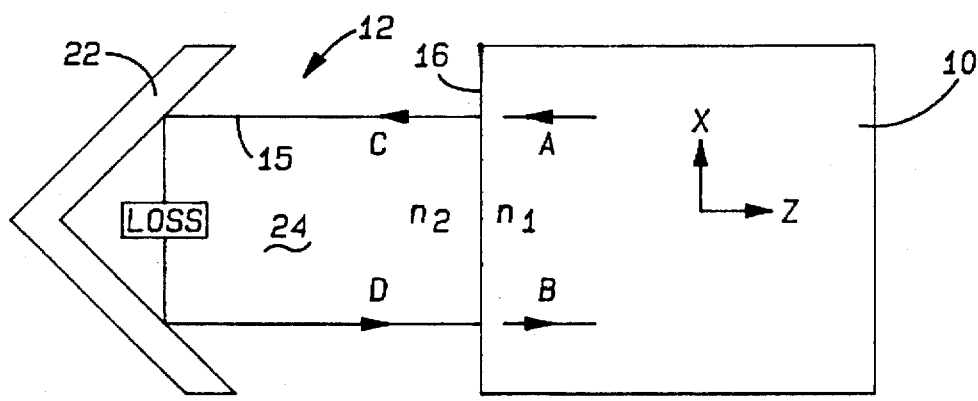
FIG. 2 is a plan view of the system shown in FIG. 1 indicating system indices of reflection and refraction.
Figure 3:
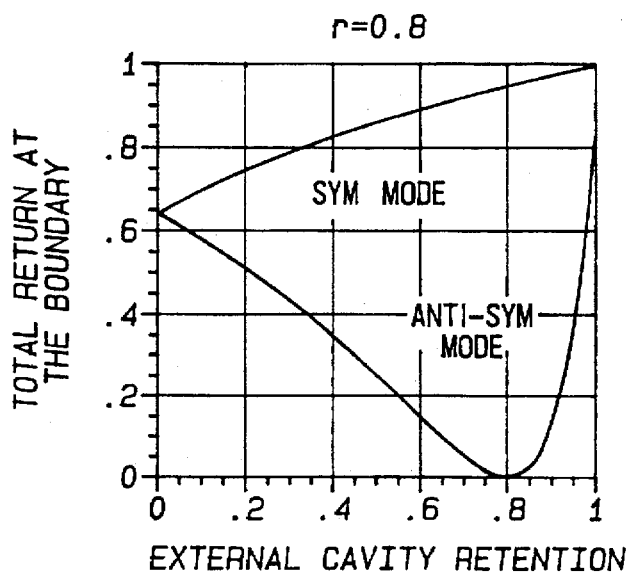
FIG. 3 is a graph of total return back into the main cavity versus the external cavity retention factor for a fixed transmittivity at the boundary.

Referring now to FIGS. 2 and 3, calculation of the parameters of the external inverse cavity will now be shown. With reference to FIG. 2, it should be understood that the figure is a plan view, with the X and Z axes oriented as shown, and with the Y axis extending in an orthogonal direction with respect to the plane of this paper. As set forth below, the amplitudes of the modes in the laser main cavity with index of reflection $n_1$ are designated A and B, where A represents the radiation travelling from right to left in the resonator cavity and B represents the radiation travelling from left to right. The amplitudes for the modes propagating in the partially transmissive medium 24, having an index of refraction $n_2$, are designated C and D, where C represents the radiation travelling from right to left in the external cavity and D represents the radiation travelling from left to right. The boundary conditions at the interface thus provide the following relations between these amplitudes:

$$\begin{pmatrix} A \\ B \end{pmatrix} = \frac{1}{r+1} \begin{pmatrix} 1 & r \\ r & 1 \end{pmatrix} \begin{pmatrix} C \\ D \end{pmatrix} \quad (1)$$

$$r = \frac{n_1 - n_2}{n_1 + n_2} \quad (2)$$

where r is the field reflectivity at the interface. Considering a round-trip propagation in the external cavity, the amplitude D, as a function of x, is related to the amplitude C as $$D(x) = abc(-x). \quad (3)$$

where a is the external cavity retention factor (i.e., a=1−loss), b=exp(ikL) is the external cavity propagation factor, and the minus sign in x is due to the inversion property of the roof-top mirror 22. Solving equation (1) above for B, the reflected radiation amplitude can be written as $$B(x) = \frac{r(1 - a^2b^2)A(x) + ab(1 - r^2)A(-x)}{1 - (abr)^2} \quad (4)$$

Using the symmetric and anti-symmetric functions of A, the reflected amplitude B becomes $$B = \frac{r + ab}{1 + abr} A_{sym} + \frac{r - ab}{1 - abr} A_{anti-sym} \quad (5)$$

The propagation factor b is thus selected through control of the external cavity length. As a result, zero reflection for anti-symmetric modes can be achieved when b=1 and r=a. When zero reflection is achieved for the anti-symmetric modes, the anti-symmetric modes are suppressed while the symmetric modes retain a high return. If a particular laser application so dictates, symmetric radiation modes may be suppressed by manipulating the above parameters so that b=−1 and r=a.

In general, a large reflectivity is required in order to obtain a significant return of the symmetric resonance modes at the main cavity\external inverse cavity boundary. By causing a high degree of reflection of the symmetric resonance modes back into the main cavity 10 and a high degree of transmission of the anti-symmetric resonance modes into the external inverse cavity 12, loss is minimized for the symmetric modes and maximized for the anti-symmetric modes. A large reflectivity can be achieved by applying an anti-reflection coating at the boundary. For example, if r is chose to be 0.8, the returns for the symmetric and anti-symmetric modes are calculated to be 0.95 and zero, respectively as shown in FIG. 3.

FIG. 3 shows the return of radiation back into the main cavity versus the external cavity retention factor for a fixed reflectivity of 0.8 at the boundary. If there is no loss in the external cavity (retention=1), the returns are 100 percent for both symmetric and anti-symmetric modes because of energy conservation. If the loss is 100 percent, there is no mode discrimination either and both returns are equal to $r^2=(0.8)^2=0.64$. Between these two extremes, the return of the symmetric mode increases with the retention factor while the anti-symmetric mode has zero return when the retention factor is equal to the reflectivity (in this case, both are 0.8). In order to have a better mode control, it is desirable to have a higher value of r because the return of the symmetric mode will be closer to one and has a larger separation from the return of the anti-symmetric mode. It is also noted that the retention factor need not be very accurate. FIG. 3 shows that the return of the anti-symmetric mode is still less than 10 percent when the retention has a value of 0.8±0.1.

As FIG. 3 indicates, system parameters do not have to be exact in order to achieve a high degree of anti-symmetric mode suppression. Thus, certain engineering requirements, such as external cavity mirror tilt and external cavity mirror to main cavity aperture distance, are less rigid when compared to present mode suppression systems. The external inverse cavity of the present invention is thus a very effective system for suppressing the undesirable anti-symmetric modes in a large-dimension or array cavity.

Referring now to FIGS. 4a–4c and 5a–5c, operation of the laser mode control system of the present invention will now be described in detail.

Figure 4A:
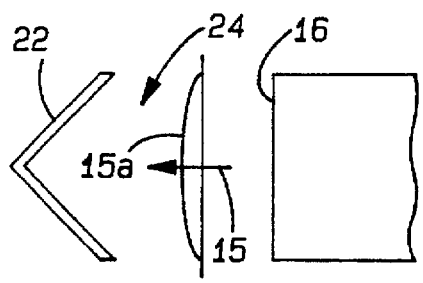
FIGS. 4a–4c illustrate the propagation of symmetric modes through the external inverse cavity of the present invention.
Figure 5A:
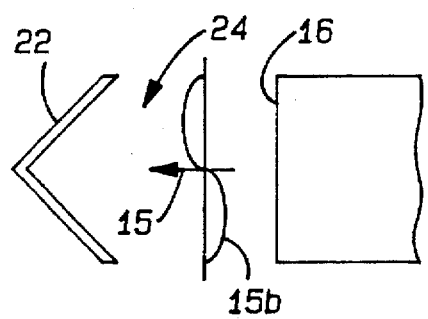
FIGS. 5a–5c illustrate the propagation of anti-symmetric modes through the external inverse cavity of the present invention.
Figure 4B:
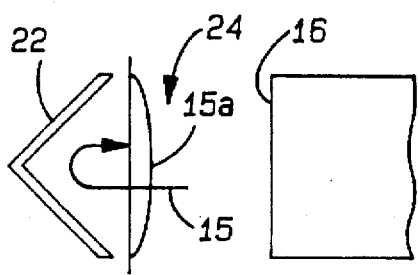
Figure 5B:
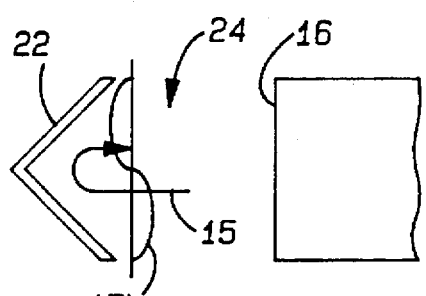
Figure 4C:
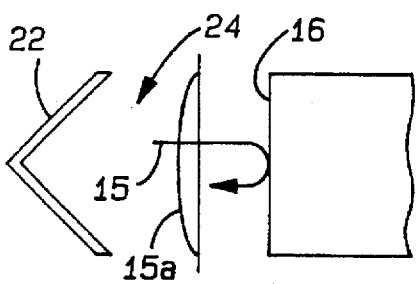
Figure 5C:
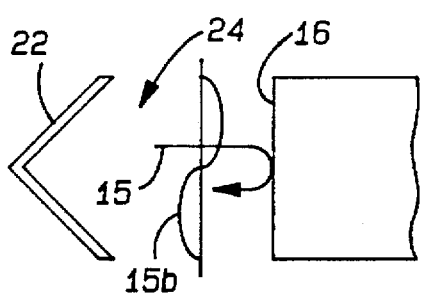

As shown in FIGS. 4a and 5a, the beam of radiation 15 propagates through the main resonator cavity 10 and is emitted through the partially transmissive plane 16. The beam of radiation 15 is reflected by the roof-top mirror 22 located adjacent the main resonator cavity as described above. The symmetric and anti-symmetric resonance modes associated with the beam of radiation are shown generally at 15a and 15b, respectively. As the beam of radiation is reflected by the roof-top mirror 22, the symmetric mode of radiation 15a shown in FIG. 4b have the same profile, while the anti-symmetric resonance mode 15b as shown in FIG. 5b changes sign in amplitude. As the beam of radiation travels through the partially transmissive medium 24 back toward the plane 16, both the loss introduced to the beam of radiation by the partially transmissive medium and the multiple reflections off of the roof-top mirror suppress the anti-symmetric resonance modes upon return of the beam of radiation to the resonator cavity plane 16 as shown in FIG. 5c, while causing minimal losses, and not suppressing, the symmetric resonance modes, as indicated in FIG. 4c.

Figure 6:
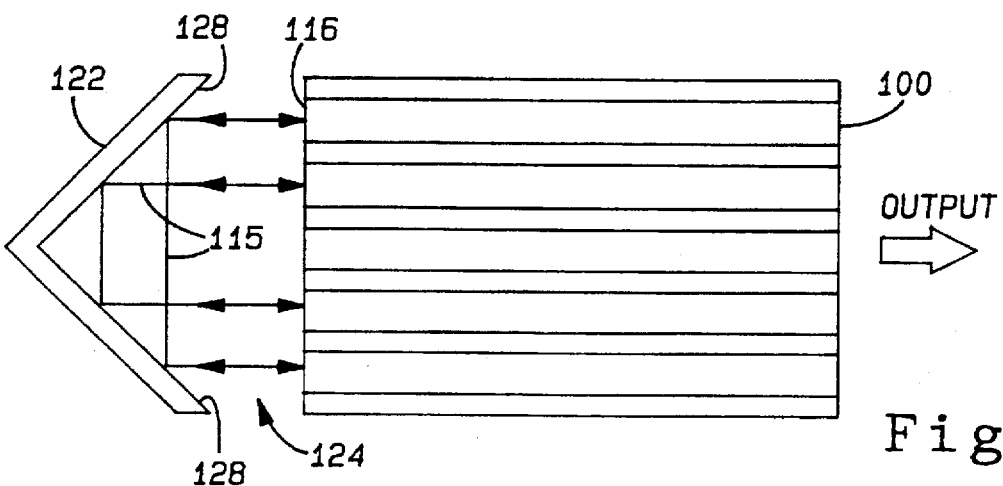
FIG. 6 is a plan view of a second embodiment of the present invention including a multi-channel type resonator.

Referring now to FIG. 6, a second embodiment according to the present invention is shown. This embodiment shows that the external inverse cavity of the present invention may also be implemented to suppress anti-symmetric modes of radiation propagating in a multi-channel resonator cavity, shown generally at 100. As shown, radiation, represented by the arrows 115, is emitted from the multi-channel cavity through the channel plane 116. The radiation travels through the partially transmissive medium 124 before being double reflected internally in the external inverse cavity off of the reflective surface 128. After being reflected from the second side of the reflective surface 128, the radiation again passes through the partially transmissive medium and enters the multi-channel cavity through the plane 116. Thus, it should be appreciated that the principal on which the anti-symmetric modes are suppressed is identical to that described above in reference to the single channel cavity shown in FIG. 1.

Figure 7:
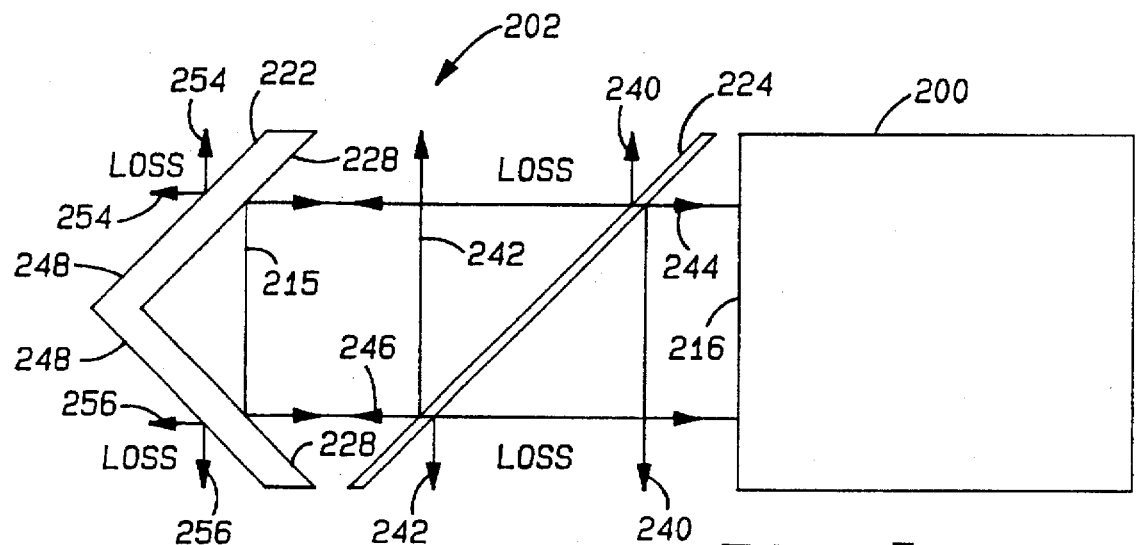
FIG. 7 is a plan view of a third embodiment of the present invention utilizing a lens for introducing losses in the external cavity.

Referring now to FIG. 7, in a third embodiment, a laser resonator cavity is shown at 200, with an external inverse cavity shown generally at 202. The resonator cavity 200 may be of the single channel or multi-channel type described above. The external inverse cavity 202 incorporates a partially transmissive mirror 224 as its partially transmissive medium. The partially transmissive mirror 224 introduces losses to the radiation, indicated generally by the arrows at 242, propagating toward the inverse mirror 222. The mirror also introduces losses shown at 240 as the radiation returns to the resonator cavity 200 through the mirror after being internally reflected by the surface 228 of the external cavity rooftop mirror 222. In addition, the mirror 224 can be set to partially transmit the radiation at its surfaces, as indicated at 244 and 246. Losses may also be induced at the partially transmissive surface 248 of the rooftop mirror 222, as indicated at 254 and 256.

At this point it should be understood that in the mode suppression system of the present invention, losses may be introduced to the radiation in the external inverse cavity solely by a partially transmissive medium, solely by a cavity mirror, or by both a partially transmissive mirror and a cavity mirror, according to the design of the particular system in view of a particular application.

Figure 8:
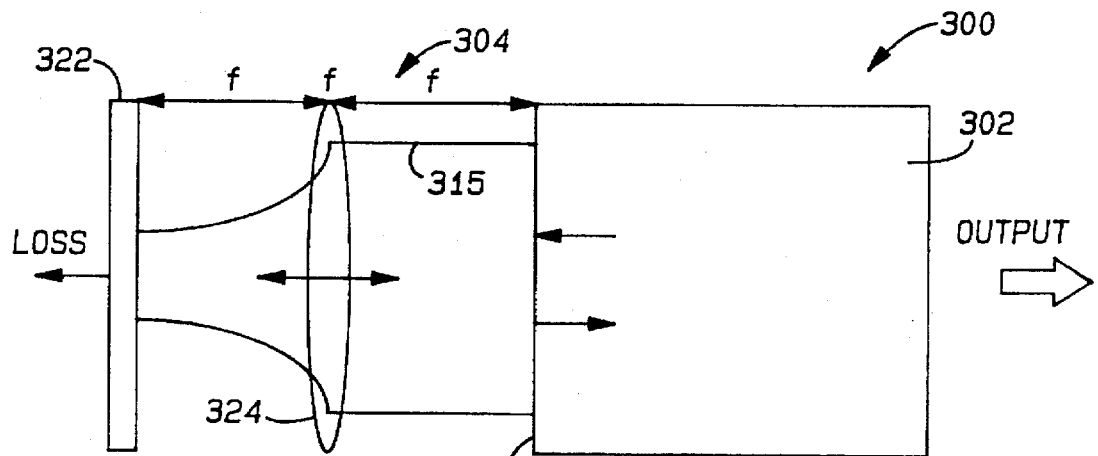
FIG. 8 is a plan view of a fourth embodiment of the present invention using re-imaging optics for mode inversion.

Referring to FIG. 8, a fourth embodiment of the system according to the present invention is shown at 300 and includes a laser resonator cavity 302. The external cavity shown in FIG. 8 at 304 differs from the earlier described embodiments in that the cavity 304 includes an external re-imaging lens 324, rather than a roof-top mirror, that induces the mode inversion. The external cavity incorporates the lens 324 for re-imaging radiation 315 emitted at the plane 316 of the main resonant cavity. After the radiation is re-imaged by the re-imaging lens, the radiation is reflected off of the mirror 322 and back into the cavity 302. In this configuration, the external cavity loss can be introduced at the reflecting mirror 322 or through a partially transmissive medium as discussed in the previous embodiments.

The configuration shown in FIG. 8 may be implemented if mode match at the boundary between the external cavity and the main cavity becomes a problem due to the long propagation distance between the external cavity and the main cavity. This particular configuration is highly effective in reflecting resonance modes associated with the radiation in such a manner that the radiation returning to the main cavity has an identical but flipped mode profile disregarding the propagation distance.

Figure 9:
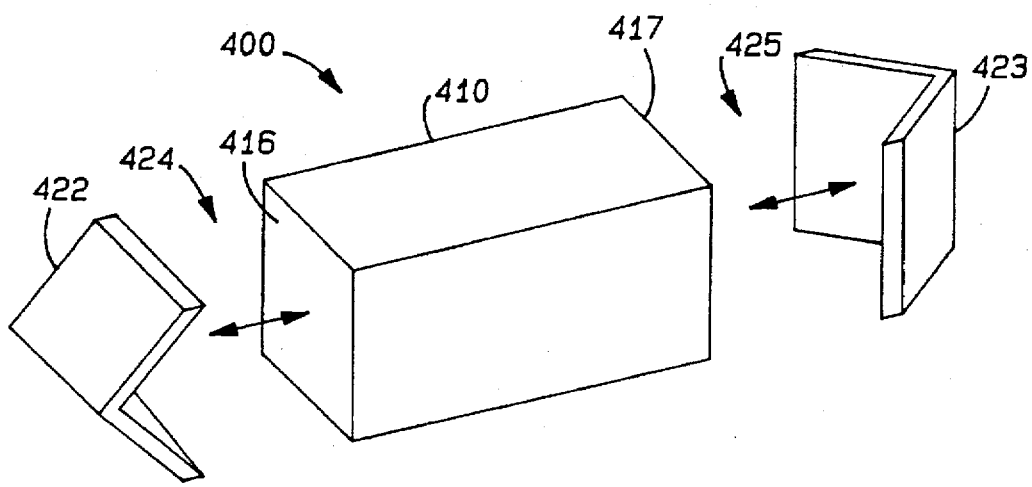
FIG. 9 illustrates a perspective view of a fifth embodiment of the present invention using a double roof-top mirror configuration.

FIG. 9 shows a fifth configuration of the present invention generally at 400 in which two roof-top mirrors 422 and 423 are implemented, along with partially transmissive mediums 424 and 425, to suppress anti-symmetric resonant modes of a beam of radiation propagating in the laser resonator cavity 410. As shown, the roof-top mirror 422 flips the anti-symmetric resonance mode in a vertical manner for vertical mode control of the anti-symmetric modes transmitted from the exit plane 416. The roof-top mirror 423 horizontally flips the anti-symmetric resonance modes, thereby providing horizontal mode control of the anti-symmetric resonance modes as the beam of radiation 415 propagates through the lossy medium 425 upon exiting the laser resonator cavity 410 through the exit plane 417. Thus, the system 400 provides two dimensional suppression of anti-symmetric resonance modes in accordance with the present invention.

It should be appreciated that the laser mode control system disclosed herein is designed for implementation in a laser system having either a single or multi-channel stable cavity or a very narrow wave guide cavity used extensively in solid state and gas lasers. Implementation of the present invention relaxes the otherwise normally stringent engineering parameters associated with present mode control devices. Further, implementation of the present invention greatly enhances accuracy of the laser system in which it is implemented. In addition, the external inverse cavity of the present invention can be implemented to achieve high precision with better quality components for a smaller cost when compared to present mode control systems. Also, the external inverse cavity of the present invention is not limited to a particular type of laser medium but is capable of being implemented in numerous types of laser arrays. As such, a more flexible, higher quality system is achieved.

Various other advantages of the present invention will become apparent to those skilled in the art after having the benefit of studying the foregoing text and drawings, taken in conjunction with the followings claims.

What is claimed is:

1. A laser mode suppression system for a beam of radiation having symmetric and anti-symmetric resonance modes, comprising:

resonator means including a resonator cavity in which said beam of radiation propagates back and forth, said resonator means including an exit plane through which said beam of radiation passes;

means for defining an external inverse cavity, including:
        a first mirror for reflecting said beam of radiation and for flipping a mode profile of said beam of radiation as said beam of radiation passes through said exit plane in said resonator means; and
        a partially transmissive medium between said exit plane of said resonator means and said mirror for introducing losses to said beam of radiation as said beam travels to and is reflected from said mirror;
    wherein said means for defining an external inverse cavity suppresses said anti-symmetric resonance modes of said beam of radiation.

2. The system of claim 1, further comprising a second exit plane located at a second end of said resonator cavity;
    means for defining a second external inverse cavity, including:

a second mirror for flipping a mode profile of said beam of radiation in a second dimension as said beam of radiation passes through said second exit plane in said resonator means; and
        a second partially transmissive medium between said second aperture of said resonator means and said second mirror for introducing losses to said beam of radiation as said beam travels to and is reflected from said second mirror;
    wherein said first and second means for defining an external inverse cavity suppress said anti-symmetric resonance modes of said beam of radiation for two-dimensional mode control of said anti-symmetric resonance modes.

3. The system of claim 2, wherein at least one of said first and second mirrors is a roof-top mirror.

4. The system of claim 1, wherein said partially transmissive medium comprises an inclined mirror.

5. The system of claim 1, wherein said partially transmissive medium comprises semiconductor material in a diode laser array.

6. The system of claim 1, wherein said first mirror comprises an external cavity lens.

7. The system of claim 1, wherein said resonator cavity comprises a single channel slab cavity.

8. The system of claim 1, wherein said resonator cavity comprises a multi-channel cavity.

9. The system of claim 1, wherein said transmitivity of said partially transmissive medium is between about 0.7 and 0.9.

10. The system of claim 1, wherein a boundary between said resonator cavity and said external inverse cavity has a reflectivity of between about 0.8 and 1.0 for said symmetric resonance modes and between about 0 and 0.1 for said anti-symmetric resonance modes.

11. In a laser system including means for generating a beam of radiation having symmetric and anti-symmetric resonance modes, and resonator means forming a resonator cavity in which said beam of radiation propagates, said resonator means including one exit plane through which said beam of radiation passes, a laser mode control system, comprising:

mirror means external to said resonator means for reflecting said beam of radiation such that a mode profile associated with said beam of radiation is flipped; and
    a partially transmissive medium located between said mirror means and said exit plane of said resonator means for introducing losses to said beam of radiation as said beam travels to and is reflected from said mirror means;
    wherein said mirror means and said partially transmissive medium suppress said anti-symmetric resonance modes of said beam of radiation.

12. A laser mode control system, comprising:

a main resonator cavity in which a beam of radiation having symmetric and anti-symmetric resonance modes propagates, said main resonator cavity having one exit plane at a first end of said cavity through which said beam of radiation passes;

means for defining an external cavity located adjacent to said exit plane outside of said main resonator cavity, including:
        a mirror for reflecting said beam of radiation passing through said exit plane and for flipping a mode profile associated with said beam of radiation upon said beam of radiation being reflected from said mirror; and a partially transmissive medium between said mirror and said main resonant cavity for introducing losses to said beam of radiation in said external cavity;

wherein said means for defining an external cavity suppresses said anti-symmetric resonance modes of said beam of radiation.

13. The system of claim 12, wherein said mirror comprises a roof-top mirror having first and second reflective surfaces and a partially transmissive surface behind said reflective surfaces.

14. A method of controlling resonance modes of a laser system, comprising the steps of:

propagating a beam of radiation having symmetric and anti-symmetric resonance modes through a main resonator cavity;

emitting said beam of radiation through an exit plane in said main resonator cavity;

reflecting said beam of radiation with a mirror external to said main resonator cavity such that a mode profile associated with said beam of radiation is flipped; and introducing losses to said beam of radiation by causing said radiation to propagate through a partially transmissive medium between said exit plane and said mirror;

wherein said steps of reflecting said radiation and introducing losses to said beam of radiation cause said anti-symmetric resonance modes of said beam of radiation to be suppressed in a first dimension.

15. The method of claim 14, further comprising the steps of:

emitting said beam of radiation through a second exit plane in a second end of said resonator cavity;

reflecting said beam of radiation with a second mirror external to said main resonator cavity such that a second mode profile associated said beam of radiation is flipped; and introducing losses to said beam of radiation by causing said radiation to propagate through a second partially transmissive medium between said second aperture and said second mirror;

wherein said steps of reflecting said radiation and introducing losses to said beam of radiation cause said anti-symmetric resonance modes of said beam of radiation to be suppressed in a second dimension different from said first dimension.

* * * * *